(12) United States Patent
Ergin et al.

(10) Patent No.: US 11,817,162 B2
(45) Date of Patent: Nov. 14, 2023

(54) ONE DIRECTION-SHIFT REGISTER ALIASING TABLE CIRCUIT SUITABLE FOR USE IN MICROPROCESSORS

(71) Applicant: TOBB EKONOMI VE TEKNOLOJI UNIVERSITESI, Ankara (TR)

(72) Inventors: Oguz Ergin, Ankara (TR); Ilker Polat, Adana (TR)

( * ) Notice: Subject to any disclaimer, the term of this patent is extended or adjusted under 35 U.S.C. 154(b) by 21 days.

(21) Appl. No.: 17/629,656

(22) PCT Filed: Aug. 5, 2020

(86) PCT No.: PCT/TR2020/050682
§ 371 (c)(1),
(2) Date: Jan. 24, 2022

(87) PCT Pub. No.: WO2021/025653
PCT Pub. Date: Feb. 11, 2021

(65) Prior Publication Data
US 2022/0254423 A1    Aug. 11, 2022

(51) Int. Cl.
| | | |
|---|---|---|
| G11C 8/10 | (2006.01) | |
| G11C 19/28 | (2006.01) | |
| G11C 7/10 | (2006.01) | |
| G11C 19/38 | (2006.01) | |

(52) U.S. Cl.
CPC .......... *G11C 19/287* (2013.01); *G11C 7/1012* (2013.01); *G11C 7/1048* (2013.01); *G11C 7/1069* (2013.01); *G11C 7/1096* (2013.01); *G11C 19/38* (2013.01)

(58) Field of Classification Search
CPC ................................................ G11C 19/287
See application file for complete search history.

(56) References Cited

U.S. PATENT DOCUMENTS

| | | | |
|---|---|---|---|
| 5,758,112 A | 5/1998 | Yeager et al. | |
| 7,406,587 B1 | 7/2008 | Zhang et al. | |
| 10,489,382 B2 * | 11/2019 | Gschwind | G06F 21/52 |
| 10,877,768 B1 * | 12/2020 | Priyadarshi | G06F 9/3855 |
| 2002/0112148 A1 | 8/2002 | Wang | |

(Continued)

FOREIGN PATENT DOCUMENTS

| | | | |
|---|---|---|---|
| CN | 101582025 A | * | 11/2009 |
| CN | 101582025 A | | 11/2009 |
| GB | 2503612 A | | 1/2014 |

OTHER PUBLICATIONS

International Search Report for corresponding PCT/TR2020/050682, dated Jan. 6, 2021.

(Continued)

*Primary Examiner* — Min Huang
(74) *Attorney, Agent, or Firm* — Egbert, McDaniel & Swartz, PLLC

(57) ABSTRACT

Disclosed are hardware configurations of the Register Aliasing Table (RAT) which are suitable for use in structures such as modern microprocessor, microcontroller, CPU etc. that use pipe line technique, perform multi-command operations, prevents Write After Read (WAR), Write After Write (WAW), Read After Write (RAW) dependencies. The Register Aliasing Table provides a circuit which consumes less energy, uses less space and has low latency compared to the applications in the state of the art.

3 Claims, 2 Drawing Sheets

(56) References Cited

U.S. PATENT DOCUMENTS

Figure 1:
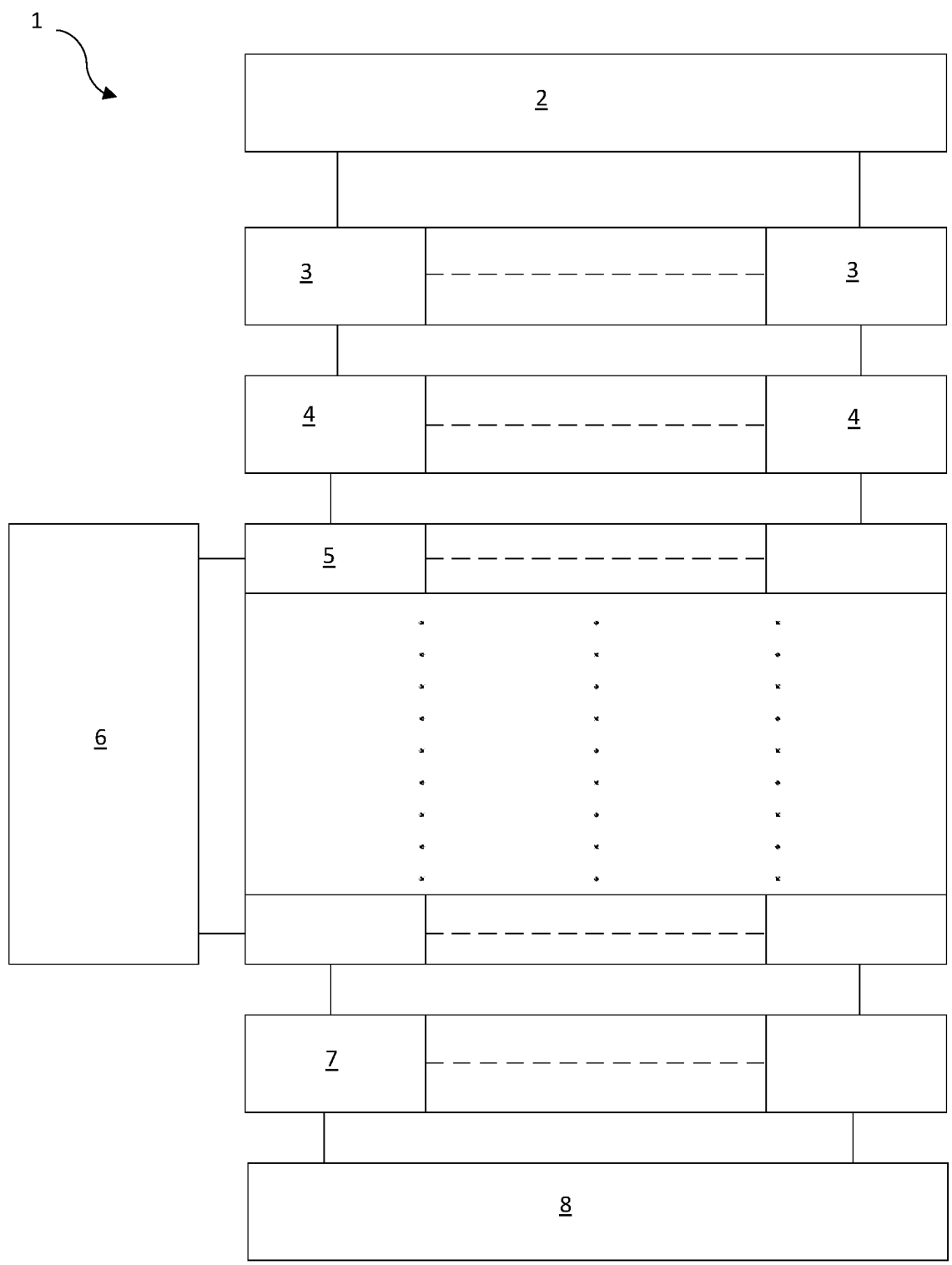

2013/0179665 A1* 7/2013 Jackson ............... G06F 9/3857
712/228

OTHER PUBLICATIONS

Written Opinion of the International Searching Authority for corresponding PCT/TR2020/050682, dated Jan. 6, 2021.
Energy Efficient Register Renaming. Lecture Notes in Computer Science. 2799. 219-228. Kucuk, Gurhan & Ergin, Oguz & Ponomarev, Dmitry & Ghose, Kanad. (2003). DOI: 10.1007/978-3-540-39762-5_28.

* cited by examiner

ONE DIRECTION-SHIFT REGISTER ALIASING TABLE CIRCUIT SUITABLE FOR USE IN MICROPROCESSORS

TECHNICAL FIELD

The present invention relates to the hardware configurations of the Register Aliasing Table (RAT) which is suitable for use in structures such as modern microprocessor, microcontroller, CPU etc. that use pipe line technique, perform multi-command operations, prevents Write After Read (WAR), Write After Write (WAW), Read After Write (RAW) dependencies.

PRIOR ART

In the microprocessors used today, since a plurality of commands are tried to be processed simultaneously, write after read, write after write and read after write (RAW) risks are created. In order to eliminate these risks, Register Aliasing Table (RAT) is used. In case the result register of a command is used by another command, the basic logic of this use depends on registering the result to another space and rewriting the result to the register when the use of result register ends. In order to realize this, much more physical registers are installed in the processor than the registers defined in the microprocessor architecture. Matching the physical registers with the architectural registers is performed by the register aliasing tables.

The selected path as a result of estimations from the branches formed based on the conditional commands is followed until the actual result is determined in the microprocessors that use pipe line technique and performs speculative execution. The register aliasing table is required to be copied with the jump forecasting as soon as the conditional command is received in order to make the correct operations instead of the operations which were performed according to the estimated path until the actual result is obtained. Therefore, if the estimation is not correct, the operations can be continued by reaching the correct table again, where the values that it keeps are different.

There are applications used for this aim in the state of the art. Copying operations of the register aliasing tables in these applications which are known as SRAM memory and CAM memory register aliasing tables can be made by shifting. These applications have very complicated circuits, because they are shifted once backwardly, are shifted one minus from the number of registers forwardly and the space and power consumption of these circuits are very high. Register aliasing table is copied at each branching. If there is an incorrect estimation, then this copy is considered. This data motion leads to excessive energy consumption since copying and restoring the copy operations are made by shifting. Moreover, the size of the area where these copies will be stored increases the production cost of the used circuits. Some patent documents in the state of the art are given herein below.

In the register aliasing table disclosed in the British patent document numbered GB2503612A in the state of the art; reading is enabled by selecting the value in the conjugate table from the saved data. Operation that requires less time can be carried out since the processing condition of a determined data is used after it is received from the storage table. There are differences in terms of drawing the data with a horizontal architecture in the present application.

In the Chinese patent document numbered CN101582025A in the state of the art; a register aliasing table is disclosed. In said document, the process is carried out by reading the relations of write after write and write after read. Therefore, the acceleration of matching and selections is provided. It provides cost advantage by occupying 1% space compared to the existing one. The technical structure disclosed in the present invention and the architecture used is completely different.

BRIEF DESCRIPTION OF THE INVENTION AND AIMS OF THE INVENTION

The aim of this invention is to provide a circuit which consumes less energy, uses less space and has low latency compared to the applications in the state of the art.

DETAILED DESCRIPTION OF THE INVENTION

Rename circuit realized for reaching the aim of this invention is illustrated in the accompanying figures, in which;

FIG. 1. Is a schematic view of the register aliasing table circuit.

Figure 2:
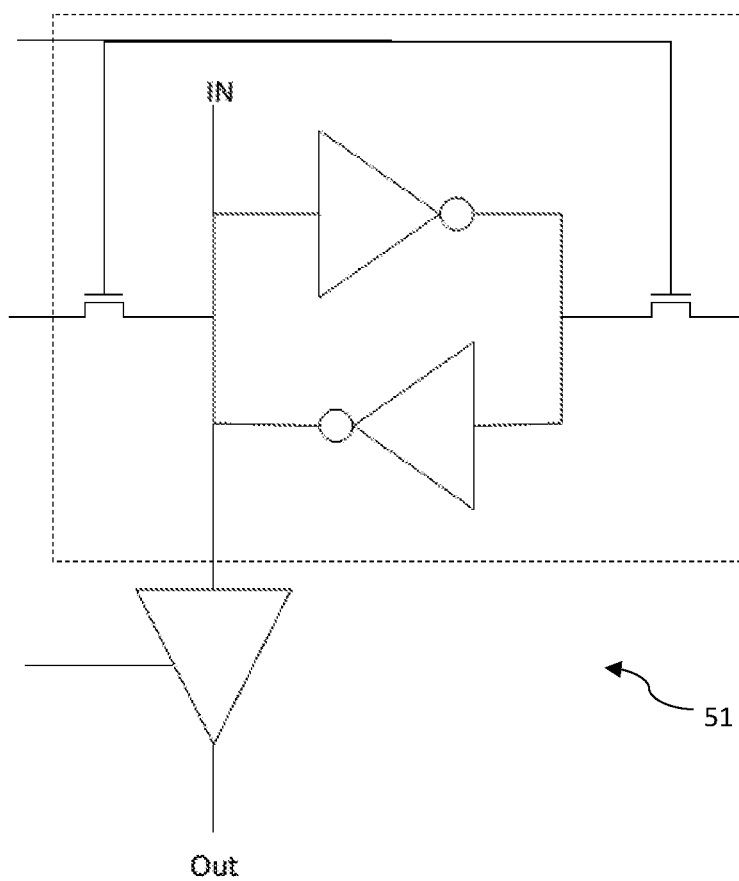

FIG. 2. Is a schematic view of a cell.

The parts in the figure are enumerated one by one and the parts correspond to these numbers are given in the following.

1. Rename circuit
2. First decoder
3. Printer driver
4. Pre-charge block
5. SRAM cell block
   51. Cell
6. Second decoder
7. Sense amplifier
8. Multiplexer The inventive one direction-shift register aliasing table circuit suitable for use in microprocessors (1) mainly comprises the following elements;

A pre-determined number of adjacently ordered printer driver (3) which are adapted to be activated during writing process, pre-charge block (4) ordered side by side with same number of buses connected to the printer drivers (3) which are adapted to ensure the buses to wait in a stable manner when reading or writing is not performed, SRAM cell block (5) which consists of cell (5) groups that are interconnectedly arranged with each other such that they have the same number of columns connected to the pre-charge blocks (4) with the same number of buses and have another number of rows determined previously, A second decoder (6) which determines the row in which the information in the cell (51) group will be copied and is adapted for executing the commands that informs about which row will be referred for information to perform the process, has an outlet that is connected to each row of SRAM cell block (4), The sense amplifiers (7) which are connected to SRAM cell block (5) in proportion with the number of columns via buses, are arranged adjacent to each other in proportion with the number of adapted columns for bringing the low output to a level that can be read, Multiplexers (8) which are connected to the sense amplifiers (7) in proportion with the number of columns via buses, are arranged adjacent to each other in proportion with the number of adapted columns for selecting from which 7-bit SRAM cell (5) group will the output required for reading be taken, A first decoder (2) which determines in which cell (51) group in the SRAM cell block (5), the reading and writing operations will be performed and determines which of said peripheral units arranged adjacent to each other will operate during operations.

In the inventive register aliasing table circuit (1), the first decoder (2) determines in which cell (51) group in the SRAM cell block (5), the reading and writing operations will be performed. The SRAM cell block (5) consists of cells (5) comprising transistors that store data in the circuit (1). In a preferred embodiment of the invention, 32 cells (5) with 7-bit and 5×32 decoders (2) with 7-bit are used. The decoder has 32 buses in this application. All of these buses are 7 bits.

The printer driver (3) is activated, when writing process will be carried out. The printer driver (3) is activated, when writing process will be carried out. In a preferred embodiment of the invention, 32 pieces of 7-bit printer driver (3) is used.

The pre-charge block (4) provides the voltage in the buses to be stable during the first half of each hour pulse of the microprocessor in the circuit (1) (namely when reading and writing process is not carried out). In a preferred embodiment of the invention, 32 pieces of 7-bit pre-charge blocks are used.

The sense amplifiers (7) provide to realize the reading process faster by detecting the voltage changes in the data paths in the circuit (1). In a preferred embodiment of the invention, 32 pieces of 7-bit sense amplifiers (7) are used.

The multiplexers (8) determined which groups of cells (51) will be chosen. When reading is performed, the information of the cell (51) chosen from the group in the row are printed. In a preferred embodiment of the invention, 32 pieces of 7-bit multiplexers are used.

The second decoder (6) enables the data to be transferred to the row below by the row which is in process at that time among the rows consisting of the cell (51) groups for copying the data when a jump command is received in order to perform an execution based on estimation when a conditional command according to the pipeline operation technique is received. Therefore, the data required to be copied remain on the previous row, and the reading and writing operations continue from the new row where the copy is received. In case it is required to return to the copied data, the second decoder (6) provides the performance of reading and writing operations over the data by returning back to the previous row. For example; If the second decoder (6) shows the row 0 and the copy command is received, then all data is copied to row 1 and from now on the operations will be made over row 1. If you require returning, row 0 is shown again. Therefore, only 1 bit shifting is performed in the copying process and only the row is changed in case it is required to return to the copy.

The first decoder (2) similar to determining in which cell (51) group in the SRAM cell block (5), the reading and writing operations will be performed, also determines which of the units arranged adjacently among the peripheral units (printer driver (3), pre-charge block (4), sense amplifier (7) will operate. Only the unit among the peripheral units in the relevant column operates depending on the cell groups where reading and writing processes will be performed. Therefore, power consumption can be reduced.

In the inventive circuit (1), the cells (51) comprise an operational amplifier which enables the data in the cell (51) to be transferred to the cell (51) below when a further jump command is received to a normal SRAM cell. The output (OUT) pin of each cell is connected to the (IN) pin of the cell that is below. The output of the cell on the bottom row is connected to the input pin of the cell which is on the top row. Therefore, all the cells (51) are connected to each other and form the rows and columns of the cell block (5). Therefore, hardware which allows for working in a circular structure in the inventive circuit (1) is formed. When the data in the bottom row is copied, the information copied from the upper rows can be added to anyone that is not required anymore.

The invention claimed is:

1. A register aliasing table for use in microprocessors, microcontrollers, or CPUs that use a pipeline technique in order to perform multi-command operations, to prevent write after read, to prevent write after write, or to prevent read after write, the risks register aliasing table comprising:
   a predetermined number of adjacently ordered printer drivers which are adapted to be activated during a writing process;
   a pre-charge block ordered side-by-side and having a same number of buses as a number of buses of said predetermined number of adjacently ordered printer drivers, the buses of said pre-charge block being connected to the buses of said predetermined number of adjacently ordered printer drivers and adapted to ensure that the buses of said predetermined number of adjacently ordered printer drivers wait in a stable manner when reading or writing is not performed;
   a static random-access memory (SRAM) cell block having a plurality of cell groups that are interconnectedly arranged with each other so as to have a number of columns connected to said pre-charge block with an equal number of buses and a number of rows;
   a second decoder that determines a row in which information in the cell group of the plurality of cell groups is to be copied and adapted to execute commands that informs which row is referred to for information to perform the process, said second decoder having an outlet that is connected to each row of the SRAM cell block;
   a plurality of sense amplifiers that are connected via buses to said SRAM cell block in proportion to the number of columns, said plurality of sense amplifiers being arranged adjacent to each other in proportion to a number of adapted columns so as to bring a low output to a higher output that can be read;
   a plurality of multiplexers connected to said plurality of sense amplifiers via buses in proportion to the number of columns, said plurality of multiplexers being arranged next to each other in proportion to the number of adapted columns so as to select from which output of the cell group of said plurality of cell groups is required for reading; and
   a first decoder which determines which cell group in the SRAM cell block the reading and writing will be performed, said first decoder determining which input is to be selected by a plurality of multiplexers and determines which write driver and pre-charge block and sense amplifier arranged adjacent to each other will operate.

2. The register aliasing table of claim 1, wherein the plurality of cell groups comprise thirty-two seven bit cell groups, and second decoder being a seven bit 5×32 decoder, wherein said predetermined number of adjacently ordered printer drivers comprises thirty-two seven bit printer drivers, said pre-charged block comprising thirty-two pieces of seven bit pre-charge blocks, said plurality of sense amplifiers comprising thirty-two pieces of seven-bit sense amplifiers, said plurality of multiplexers comprising thirty-two pieces of seven-bit multiplexers.

3. The register aliasing table of claim 1, further comprising:
 a plurality of cells each having an operational amplifier so as to transfer data to a cell of said plurality of cells that is one below the cell when a jump command is recessed.

\* \* \* \* \*